(12) United States Patent
Yang

(10) Patent No.: US 8,236,608 B2
(45) Date of Patent: Aug. 7, 2012

(54) STACKING PACKAGE STRUCTURE WITH CHIP EMBEDDED INSIDE AND DIE HAVING THROUGH SILICON VIA AND METHOD OF THE SAME

(75) Inventor: Wen-Kun Yang, Hsin-Chu (TW)

(73) Assignee: King Dragon International Inc., Road Town (BV)

( * ) Notice: Subject to any disclaimer, the term of this patent is extended or adjusted under 35 U.S.C. 154(b) by 0 days.

(21) Appl. No.: 13/093,226

(22) Filed: Apr. 25, 2011

(65) Prior Publication Data

US 2011/0195546 A1 Aug. 11, 2011

Related U.S. Application Data

(60) Division of application No. 12/385,358, filed on Apr. 6, 2009, now Pat. No. 8,106,504, which is a continuation-in-part of application No. 12/232,847, filed on Sep. 25, 2008.

(51) Int. Cl.
*H01L 21/00* (2006.01)

(52) U.S. Cl. .......... 438/109; 438/51; 438/106; 438/110; 438/113; 438/121

(58) Field of Classification Search .................... 438/51, 438/106, 109, 110, 113, 121, 124, FOR. 340, 438/FOR. 367, FOR. 368
See application file for complete search history.

(56) References Cited

U.S. PATENT DOCUMENTS

| 6,239,482 | B1 * | 5/2001 | Fillion et al. .................. 257/678 |
| 6,271,469 | B1 * | 8/2001 | Ma et al. ........................ 174/521 |
| 6,506,632 | B1 * | 1/2003 | Cheng et al. .................. 438/126 |
| 2008/0237828 | A1 * | 10/2008 | Yang .............................. 257/690 |
| 2008/0237879 | A1 * | 10/2008 | Yang .............................. 257/774 |
| 2009/0166873 | A1 * | 7/2009 | Yang et al. ..................... 257/758 |

OTHER PUBLICATIONS

Office Action for related U.S. Appl. No. 12/385,358 dated Jun. 14, 2011 pp. 1-17.

* cited by examiner

*Primary Examiner* — N Drew Richards
*Assistant Examiner* — Joannie A Garcia
(74) *Attorney, Agent, or Firm* — Ditthavong Mori & Steiner, P.C.

(57) ABSTRACT

The semiconductor device package structure includes a first die with a through silicon via (TSV) open from back side of the first die to expose bonding pads; a build up layer coupled between the bonding pads to terminal metal pads by the through silicon via (TSV); a substrate with a second die embedded inside and top circuit wiring and bottom circuit wiring on top and bottom side of the substrate respectively; and a conductive through hole structure coupled between the terminal metal pads to the top circuit wiring and the bottom circuit wiring.

4 Claims, 5 Drawing Sheets

STACKING PACKAGE STRUCTURE WITH CHIP EMBEDDED INSIDE AND DIE HAVING THROUGH SILICON VIA AND METHOD OF THE SAME

The invention is a divisional of application Ser. No. 12/385,358, filed on Apr. 6, 2009, which is a Continuation-In-Part (CIP) of application Ser. No. 12/232,847 filed on Sep. 25, 2008 by the inventor.

FIELD OF THE INVENTION

This invention relates to a semiconductor device package, and more particularly to a stacking structure of package.

DESCRIPTION OF THE PRIOR ART

The function of chip package includes power distribution, signal distribution, heat dissipation, protection and support. As a semiconductor become more complicated, the traditional package technique, for example lead frame package, flex package, rigid package technique, can't meet the demand of producing smaller chip with high density elements on the chip. In general, array packaging such as Ball Grid Array (BGA) packages provide a high density of interconnects relative to the surface area of the package. Typical BGA packages include a convoluted signal path, giving rise to high impedance and an inefficient thermal path which results in poor thermal dissipation performance. With increasing package density, the spreading of heat generated by the device is increasingly important. In order to meet packaging requirements for newer generations of electronic products, efforts have been expended to create reliable, cost-effective, small, and high-performance packages. Such requirements are, for example, reductions in electrical signal propagation delays, reductions in overall component area, and broader latitude in input/output (I/O) connection pad placement. In order to meet those requirements, a WLP (wafer level package) has been developed, wherein an array of I/O terminals is distributed over the active surface, rather than peripheral-leaded package. Such distribution of terminal may increase the number of I/O terminals and improves the electrical performance of the device. Further, the area occupied by the IC with interconnections when mounted on a printed circuit board is merely the size of the chip, rather than the size of a packaging leadframe. Thus, the size of the WLP may be made very small. One such type may refer to chip-scale package (CSP).

Improvements in IC packages are driven by industry demands for increased thermal and electrical performance and decreased size and cost of manufacture. In the field of semiconductor devices, the device density is increased and the device dimension is reduced, continuously. The demand for the packaging or interconnecting techniques in such high density devices is also increased to fit the situation mentioned above. The formation of the solder bumps may be carried out by using a solder composite material. Flip-chip technology is well known in the art for electrically connecting a die to a mounting substrate such as a printed wiring board. The active surface of the die is subject to numerous electrical couplings that are usually brought to the edge of the chip. Electrical connections are deposited as terminals on the active surface of a flip-chip. The bumps include solders and/or plastics that make mechanical connections and electrical couplings to a substrate. The solder bumps after RDL have bump high around 50-100 um. The chip is inverted onto a mounting substrate with the bumps aligned to bonding pads on the mounting substrate, as shown in FIG. 1. If the bumps are solder bumps, the solder bumps on the flip-chip are soldered to the bonding pads on the substrate. Solder joints are relatively inexpensive, but exhibit increased electrical resistance as well as cracks and voids over time due to fatigue from thermo-mechanical stresses. Further, the solder is typically a tin-lead alloy and lead-based materials are becoming far less popular due to environmental concerns over disposing of toxic materials and leaching of toxic materials into ground water supplies.

Furthermore, because conventional package technologies have to divide a dice on a wafer into respective dies and then package the die respectively, therefore, these techniques are time consuming for manufacturing process. Since the chip package technique is highly influenced by the development of integrated circuits, therefore, as the size of electronics has become demanding, so does the package technique. For the reasons mentioned above, the trend of package technique is toward ball grid array (BGA), flip chip (FC-BGA), chip scale package (CSP), Wafer level package (WLP) today. "Wafer level package" is to be understood as meaning that the entire packaging and all the interconnections on the wafer as well as other processing steps are carried out before the singulation (dicing) into chips (dice). Generally, after completion of all assembling processes or packaging processes, individual semiconductor packages are separated from a wafer having a plurality of semiconductor dies. The wafer level package has extremely small dimensions combined with extremely good electrical properties. In FIG. 9, the prior art was announced on April 2006 by Samsung Electronics, and it shows the 3D stacking structure with smallest form factor by using the wafer level processed to stack the silicon chips 901 with TSV (through silicon via) interconnects 902. But, it only can handle the semiconductor device with the same die size and the same pads (TSV) location structure, it must be designed in advanced. It could not be used for different chips with different die size, so, and it normally be used for higher density memory applications.

The conventional die is only covered by glass and other surfaces of the die are exposed. It is possible to crash the die by external force. The process is also complicated, therefore, the present invention provides a safer scheme to overcome the aforementioned problem and also provide the better device performance.

SUMMARY OF THE INVENTION

An object of the present invention is to provide a semiconductor device package (chip assembly) that provides a low cost, high performance and high reliability package.

A semiconductor device package structure of the present invention includes a first die with a through silicon via (TSV) open from back side of the first die to expose bonding pads; a build up layer coupled between the bonding pads to terminal metal pads by the through silicon via (TSV); a substrate with a second die embedded inside and top circuit wiring and bottom circuit wiring on top and bottom side of the substrate respectively; and a conductive through hole structure coupled between the terminal metal pads to the top circuit wiring and the bottom circuit wiring.

The semiconductor device package structure further comprises solder balls melted on terminal pads, wherein the terminal pads located under the substrate and/or the first die. The build up layer includes a first dielectric layer and a second dielectric layer on the first dielectric layer. The material of the substrate includes FR4, FR5, BT, PI and epoxy resin. The semiconductor device package structure further comprises adhesion material encapsulated around the second die, and the adhesion material includes elastic material. The first die includes an image sensor, an optic device, a memory device, a logic device, an analog device or a CPU device. The materials of the conductive through hole structure includes Cu, Cu/Ni or Sn/Ag/Cu. The foot print size of the substrate can be larger than the size of the second die. The structure further comprises a top build up layer formed on said second die and said substrate, and a bottom build up layer formed under the second die and the substrate. The top build up layer includes a third dielectric layer, a RDL, a via coupled to metal pads of the second die and the RDL, and a fourth dielectric layer on the third dielectric layer to cover the RDL. The bottom build up layer includes a fifth dielectric layer, a second RDL, a second terminal metal pads coupled to the second RDL, and a sixth dielectric layer on the fifth dielectric layer to cover the second RDL. The structure comprises a second substrate under the substrate, and the second substrate with second top circuit wiring and second bottom circuit wiring on top and bottom side of the second substrate respectively.

A method of forming a semiconductor die assembly, comprising: bonding a panel substrate facing to the backside of a silicon wafer; curing an adhesion dielectric layer that is formed on the panel substrate; sputtering a seed metal layer from the back side of the panel substrate; coating a photo resist from the back side of the panel substrate and opening a through hole area; filling metal material into the through hole area to inter-connecting bonding pads of a die to final terminal pads of the panel substrate; and stripping the photo resist and etching the seed metal layer.

The method further comprises a step of aligning the circuit side of the panel substrate facing to the backside of the silicon wafer before bonding the panel substrate. The method further comprises a step of forming solder balls on under bump metallurgy (UBM) of the panel substrate after stripping the photo resist.

DESCRIPTION OF THE PREFERRED EMBODIMENT

The invention is relative to continues in part (CIP) of application Ser. No. 12/232,847 that filing on date Sep. 25, 2008 by the inventor.

The invention will now be described in greater detail with preferred embodiments of the invention and illustrations attached. Nevertheless, it should be recognized that the preferred embodiments of the invention is only for illustrating. Besides the preferred embodiment mentioned here, present invention can be practiced in a wide range of other embodiments besides those explicitly described, and the scope of the present invention is expressly not limited expect as specified in the accompanying Claims.

Figure 3:
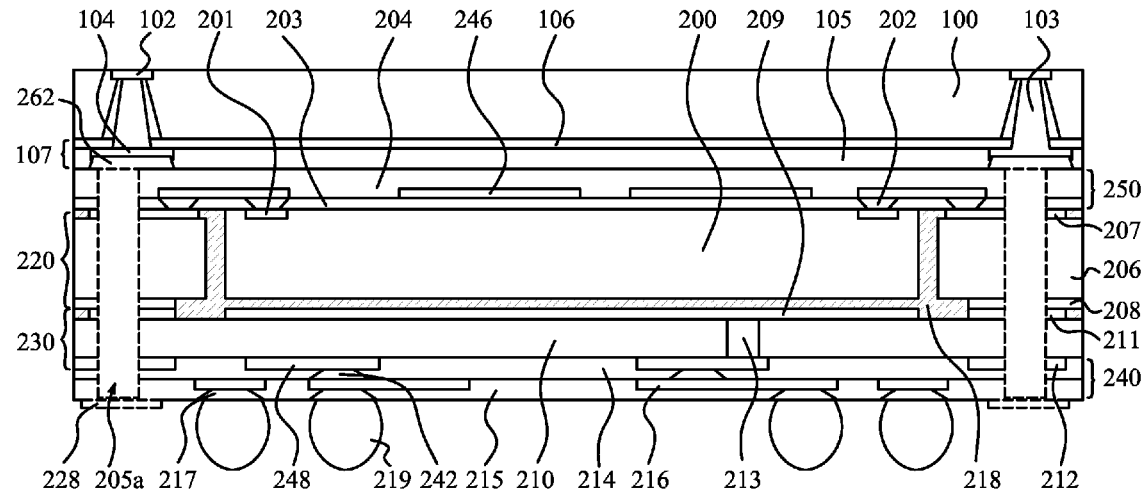
FIG. 3 illustrates a cross section view showing a stacking semiconductor chips assembly in accordance with embodiment of the present invention.
Figure 4:
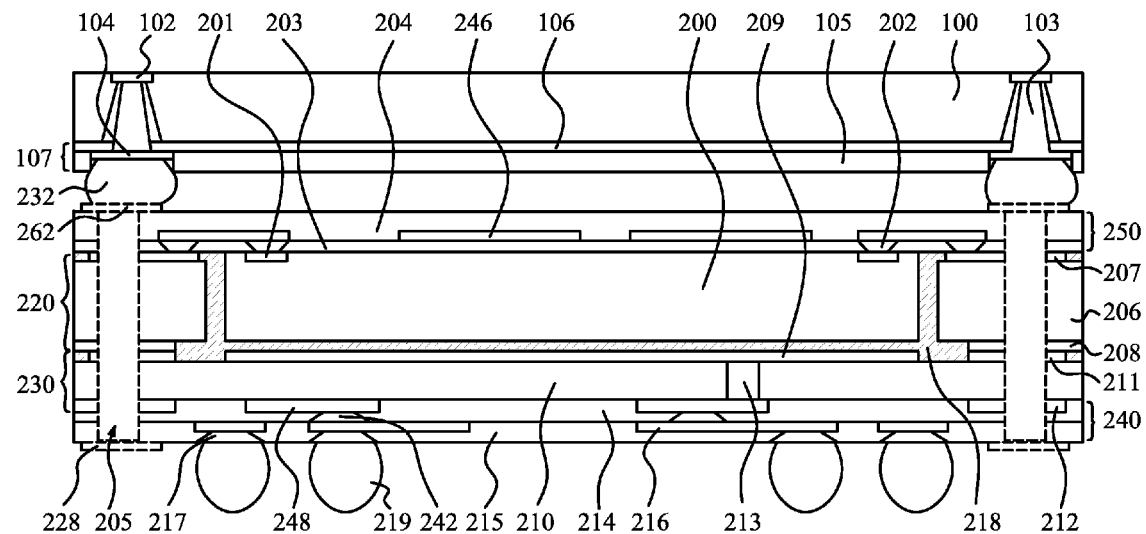
FIG. 4 illustrates a cross section view showing a stacking semiconductor chips assembly in accordance with embodiment of the present invention.
Figure 6:
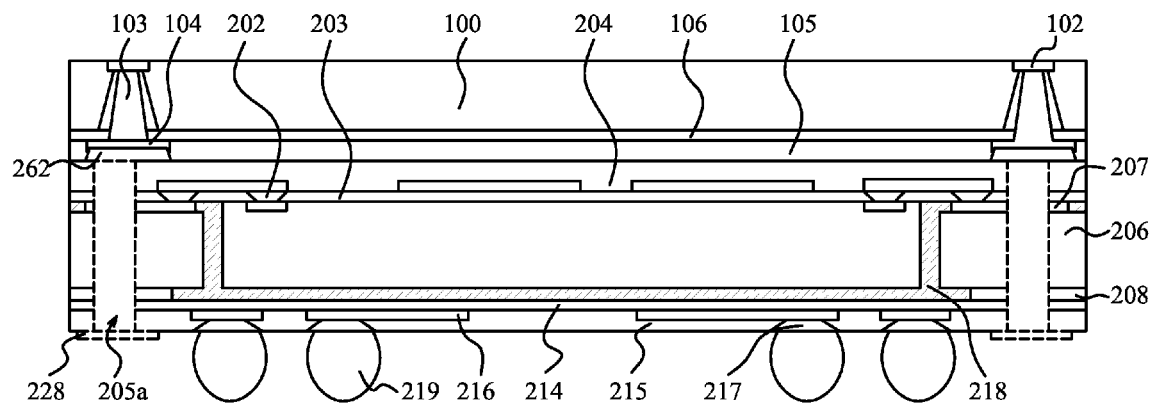
FIG. 6 illustrates a cross section view showing a stacking semiconductor chip assembly in accordance with embodiment of the present invention.

The present invention discloses a stacking semiconductor device package structure. The present invention provide a semiconductor chip assembly which includes a panel substrate with the second die embedded inside, and a wafer level package with through silicon via (TSV) as shown in FIGS. 3, 4 and 6.

Figure 1:
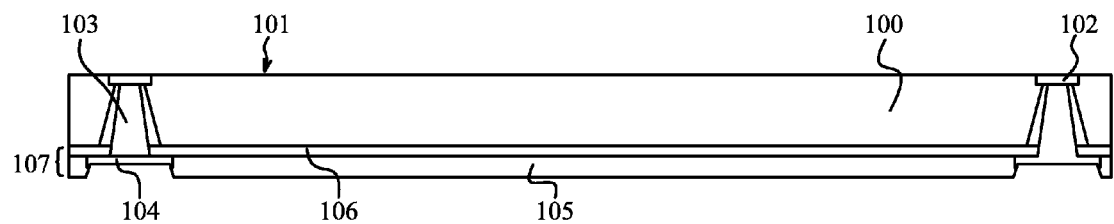
FIG. 1 is cross-sectional view showing a wafer level package with through silicon via (TSV) and build up layer on the back side of the first die in accordance with embodiment of the present invention.

FIG. 1 is cross-sectional view of a silicon wafer with a semiconductor die 100 with bonding pads 102 formed on the circuit side 101 of the die 100. In one case, the die 100 includes an image sensor, an optic device, a memory device, a logic device, an analog device or a CPU device. The silicon wafer 701, shown in FIG. 7, has a through silicon via (TSV) 103 formed on the back side of the silicon wafer (opening the via of bonding pads) to connect the bonding pads 102. The die is CMOS sensor for one embodiment. Build up layers 107 is formed under back side of the silicon wafer to connect the metal pads 104 and bonding pads 102 through TSV 103. If the pitch of the bonding pads 102 is too small for making the metal pads and further process, then it can be only to make the metal pads 104 under the bonding pads 102 without redistribution layer (RDL). Build up layers 107 include first dielectric layer 106 formed on the back side of the silicon wafer, and second adhesive dielectric layer 105 formed on the first dielectric layer 106. For example, the first dielectric layer 106 and the second dielectric layer 105 are coated on the back side of the silicon wafer and to open the TSV 103 (no curing) by a lithography process, and thereby the metal pads 104 coupled to the TSV 103.

Figure 2:
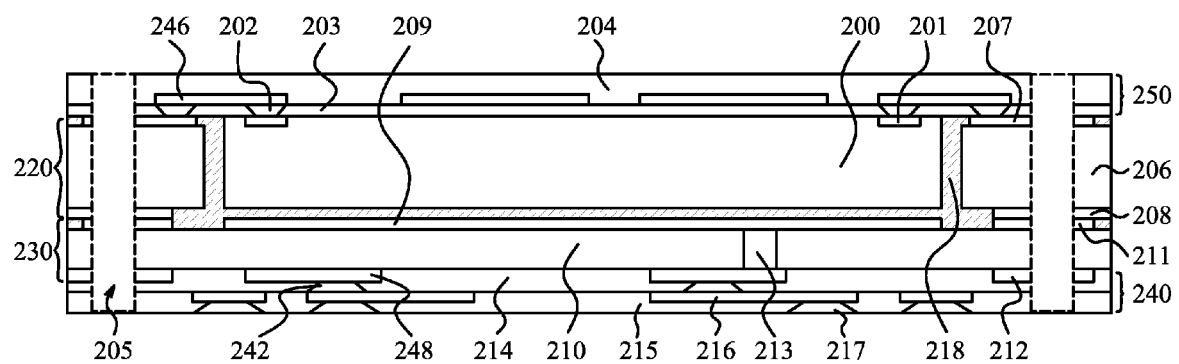
FIG. 2 illustrates a cross section view showing a panel substrate with the second die embedded inside, double build up layers and through holes in accordance with embodiment of the present invention.
Figure 7:
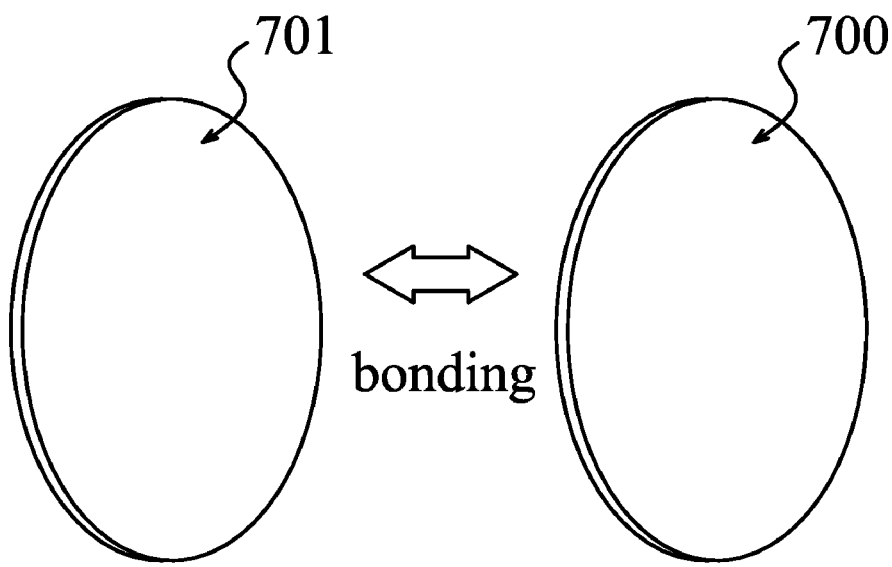
FIG. 7 illustrates a view showing wafer back side and substrate back side in accordance with embodiment of the present invention.

FIG. 2 illustrates a cross section view showing a panel substrate with the second die embedded inside (note: the second die including multi-chips with side-by-side structure), double build up layers and through holes passing through the panel substrate. In this case, the panel substrate 700, shown in FIG. 7, is a multi-layer panel substrate. The panel substrate size is the same as the wafer size. The foot print size of the substrate may be larger than the size of the die/chip 200. For example, the substrate is composed of FR4, FR5, BT, PI and epoxy resin, preferably, it is BT base with fiber glass formed therein. The chip 200 is adhered on the surface of a second substrate 210 by an adhesive material 218. It could have the elastic properties to absorb the stress generated by thermal. The adhesive material 218 is encapsulated around the chip 200. The chip 200 has bonding pads 201 coupled to a redistributed metal layers (RDL) 246 through via 202. The pads 201 could be Al, Cu pads or other metal pads. Top build up layers 250 is formed on the surface of the chip 200 and a substrate 206. The top build up layers 250 include a dielectric layer 203, via 202, RDL 246 and an adhesive dielectric layer 204, wherein the dielectric layer 203 is formed on the surface of the chip 200 and the substrate 206, and the adhesive dielectric layer 204 formed on the dielectric layer 203 to cover the RDL 246. The RDL 246 is formed by an electroplating, plating or etching method. The copper electroplating operation continues until the copper layer has the desired thickness. Conductive layers extend out of the area for receiving chip. It refers to fan-out scheme. The fan-out scheme has better thermal dissipation and larger pitch between balls for reducing the signal interference. The top build up layers 250 are formed on the chip circuit side to connect the bonding pads 201 of the chip 200 to circuit wiring 207 through via 202 and RDL 246. For example, the dielectric layer 203 and the dielectric layer 204 are coated on the surface of the die 200 and the substrate 206 with openings for the via 202 by a lithography process, and the bonding pads 201 coupled to the RDL 246 through the via 202. It prefers as thin as possible for the dielectric layer 203 for better reliability concerning. The substrate 206 has preformed top circuit wiring 207 formed over the substrate 206 and bottom circuit wiring 208 formed under the substrate 206, such as to form a BT-CCL (Bismaleimide Triazine-Copper Clad Laminate) substrate 220. In one embodiment, raw BT substrate does not have through hole, but have circuit wiring on both side of the substrate. In one case, the material of the substrate will be PI, BT, FR4, FR5, PCB, Silicon, Ceramic, Glass, Metal, Alloy or the like. Alternatively, if the substrate is selected from silicone rubber, silicone resin, modified epoxy resin, EMC or the like. It suits for (vacuum) printing method.

The substrate 210 has a die metal pad 209 (for heat dispatch) and a preformed circuit wiring pattern 211 formed on top surface, and a circuit wiring pattern 212 on bottom surface of the substrate 210, such as to form a BT-CCL (Bismaleimide Triazine-Copper Clad Laminate) substrate 230. A connecting conductive through holes 213 may be formed for passing through the substrate 210 connected to the circuit wiring pattern 209, 248 for ground (GND) and heat sink application. The die/chip 200 has back side with adhesive material 218 attached on the die metal pads 209 of the substrate 210. The adhesion material (it can be acted as stress buffer to absorb the thermal stress due to CTE mismatching concern) 218 is filled into the gap between back side of the die 200 and top surface of the substrate 210 and between the side wall of the die 200 and the side wall of the die opening window. The adhesion material 218 is printed, coated or dispensed under the bottom surface of the die 200, thereby sealing the die 200. The adhesion material 218 is formed adjacent to the die 200 for protection. In one embodiment, the adhesion material 218 covers on the top surface of the substrate 206 and the surface of the die 200 except bonding pads 201, and under the build up layers 250. The surface level of the die 200 and surface level of the substrate 206 is at same level by the adhesion material 218. A connecting conductive through holes 205 may be formed for passing through the substrates 206 and 210. The conductive through holes 205 of the substrate may be performed by computer numerical control (CNC) or laser drill.

Bottom build up layers 240 is the optional structure and process, and it is formed under the surface of the chip 200 and the substrate 210. The bottom build up layers 240 include a dielectric layer 214, via 242, UBM 217, RDL 248, 216 and a dielectric layer 215, wherein the dielectric layer 214 with openings for via 242 formed therein is formed under the surface of the substrate 210, and the dielectric layer 215 formed under the dielectric layer 214 to cover the RDL 246. For example, the dielectric layer 214 and the dielectric layer 215 are coated on the surface of the substrate 210 with openings for the via 242, UBM 217 by a lithography process, and the via 242 coupled to the UBM 217 through the RDL 216. UBM 217 acts as solder metal pads.

Figure 8:
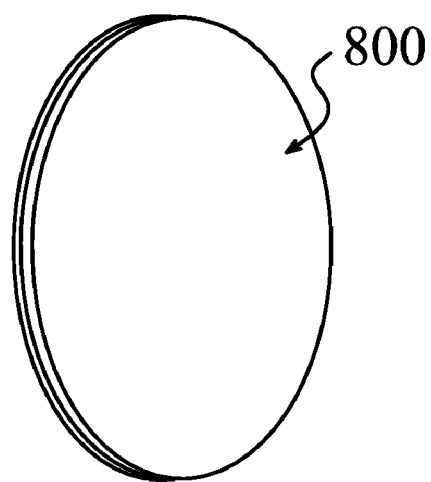
FIG. 8 illustrates a view showing stacking semiconductor chip assembly in accordance with embodiment of the present invention.
Figure 9:
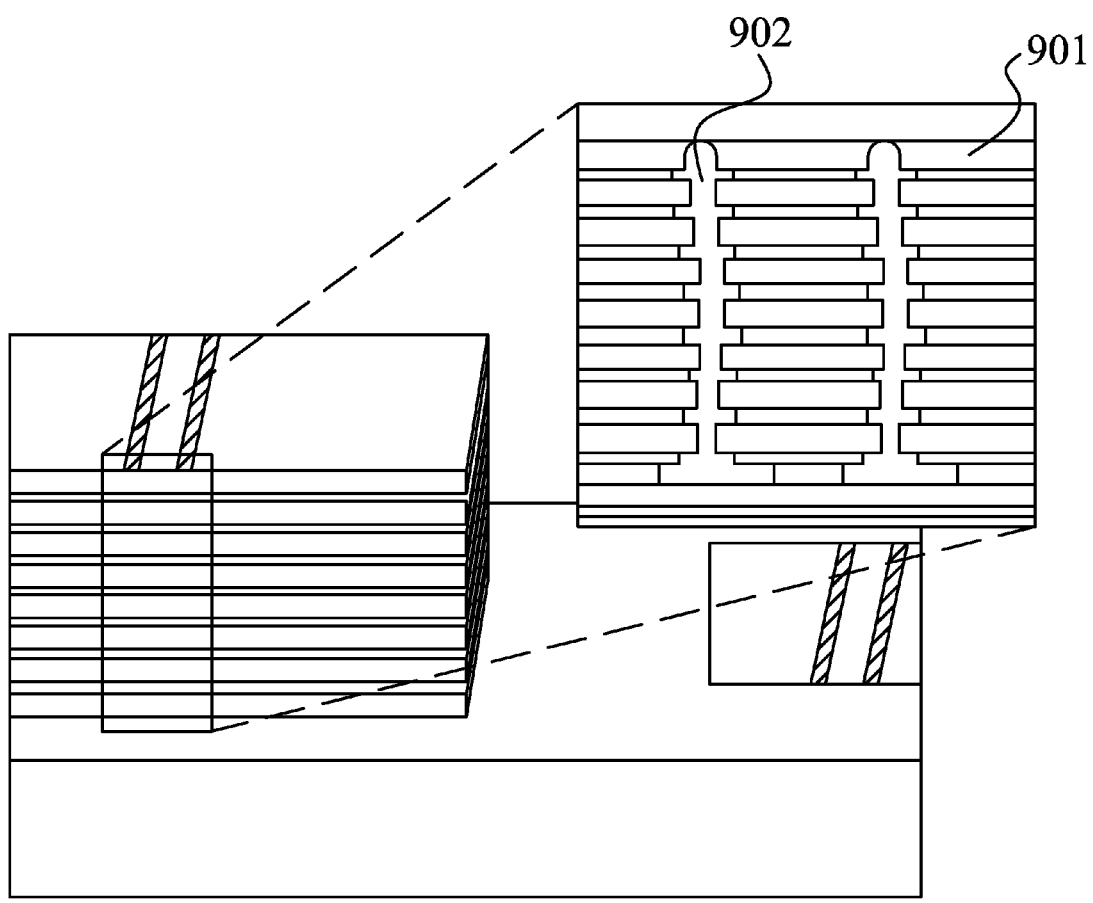
FIG. 9 illustrates a view showing stacking semiconductor chips assembly in accordance with the prior art.

FIG. 3 illustrates a cross section view showing a stacking semiconductor chips assembly which may be constructed by connecting two units of the previously embodiments, such as combining the silicon wafer of the FIG. 1 with the panel substrate of the FIG. 2. It illustrates the face-to-face scheme with CNC through hole having E-plating Cu therein. In the scheme, the upper package is stacked on the lower package by the substrates 206 and 210. Pluralities of CNC through holes 205a with plating Cu/Ni/Au are formed and penetrated from the top to bottom of the stacking structure. One aspects of the embodiment is that the active surfaces (the surface includes the metal pads 104, 262) of both packages are face-to-face configuration. As shown in FIG. 2, the panel substrate including the substrate 206 and the substrate 210 has the second die 200 embedded inside, double build up layers 250, 240 and through holes 205 passing through the panel substrate. Please refer to FIG. 8, it shows the wafer back side 701 and opposite of the substrate back side 700 are bonded together at vacuum condition to form a stacking semiconductor chips structure 800. It should be noted that the adhesion dielectric layer is then cured. The conductive through holes 205 is therefore filled the conductive materials to form a conductive through hole structure 205a after bonding. In one embodiment, materials of the conductive through hole structure 205a includes Cu, Cu/Ni or Sn/Ag/Cu. The conductive through hole structure 205a has top metal pads 262 formed thereon and bottom metal pads 228 formed under the conductive through hole structure 205a. It may be noted that the top metal pads 262 is coupled (interconnecting) to the metal pads 104. The second adhesive dielectric layer 105 is connected to the adhesive dielectric layer 204. Solder balls or solder join (conductive bumps) 219 is formed on the UBM (Under Bump Metallurgy) 217 to act as final terminal pads. In further application, the multi wafers with the same structure as the first die (wafer) be bonded—stacked (interconnecting) on the top (circuit side) of the first die. Using the same kinds of application, the multi panel substrate with chips embedded also can be stacked together. Another embodiment of the present invention is to mount the CSP, WL-CSP, mini BGA and passive components on top the first die by using the SMT process. Of cause, by using this application, it needs the wiring circuit that be made on the top surface of the first die.

FIG. 4 shows alternative embodiment of the present invention. Most of the structure is similar to the embodiment of above, except the interconnecting structures 232 which are coupled between the metal pads 104 under the surface of TSV 103 and the metal pads 262 over the surface of the through hole structure 205a. It means that the metal pads 262 and 104 will be acted as UBM.

Figure 5:
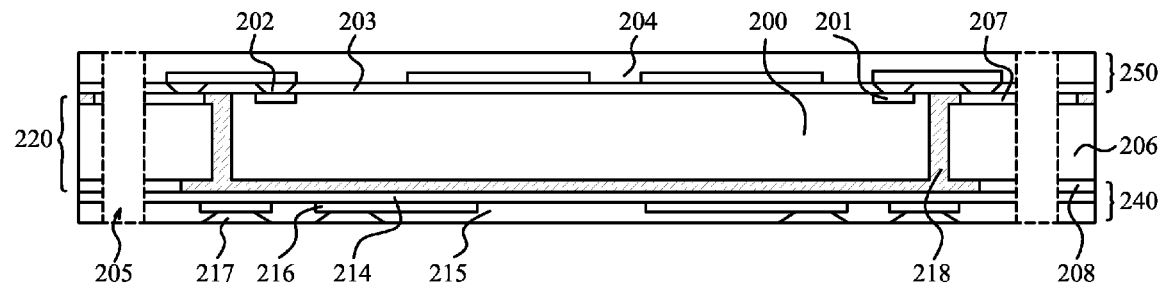
FIG. 5 illustrates a cross section view showing a panel substrate with the second die embedded inside and build up layers and through holes passing through in accordance with further embodiment of the present invention.

Please refer to FIGS. 5 and 6, they show alternative embodiment of the present invention. However, in this case, the panel substrate is a single panel substrate. The thickness of the package structure may be thinner than that of the FIGS. 3 and 4. Most of the structure is similar to the embodiment of above, and the detailed description is omitted.

Advantages: the package size is independent to the chip size and may keep the same ball pitch with the one of the chip. It offers better reliability in via inter-connecting. The chip's active surface is protected during process and it provides better electrical isolation from top surface. Thinner chip is better for reliability and it provides easy processes to form the thinner chips. Stacking package maybe provided easily, it is also easy to fan-out the terminal pins.

The method of forming a semiconductor die assembly comprises: aligning the circuit side of a panel substrate facing to the backside of a silicon wafer, and bonding together at vacuum condition, and then curing the adhesion dielectric layer that is formed on the panel substrate, followed by RIE cleaning. Next, seed metal, such as Ti/Cu, is sputtered from the back side of the substrate and photo resist is coated or laminated and then open the through hole area by a photolithography process. The next step is E-plating Cu or filling the Cu paste into through hole area to become conductive to inter-connecting the bonding pads of a die to the final terminal pads of the substrate, followed by stripping photo resist and etching seed metal Cu/Ti to form the inter-connecting structure. Finally, solder balls are placed on under bump metallurgy (UBM) and then reflowing (for BGA type). Typically, under bump metallurgy (UBM) is formed before the formation of the ball as the barrier and adhesion for preventing the issue between the ball and the ball pad.

Although preferred embodiments of the present invention have been described, it will be understood by those skilled in the art that the present invention should not be limited to the described preferred embodiment. Rather, various changes and modifications can be made within the spirit and scope of the present invention, as defined by the following Claims.

What is claimed is:

1. A method of forming a semiconductor die assembly, comprising:
    aligning an inter-connecting bonding pad and a through silicon via of a silicon wafer which includes a first die to a through hole passing through a panel substrate which includes a second die embedded therein, thereby bonding said panel substrate facing to the backside of said silicon wafer, wherein said through silicon via is formed to connect said inter-connecting bonding pad;
    curing an adhesion dielectric layer that is formed on said panel substrate;
    sputtering a seed metal layer from the back side of said panel substrate;
    coating a photo resist from the back side of said panel substrate and opening said through hole area;
    filling a metal material into said through hole area to couple to said inter-connecting bonding pad of said first die and said through silicon via, and to couple to final terminal pads of said panel substrate; and
    stripping said photo resist and etching said seed metal layer.

2. The method of claim 1, further comprising a step of forming solder balls on under bump metallurgy (UBM) of said panel substrate after stripping said photo resist.

3. The method of claim 1, wherein the material of said panel substrate includes FR4, FR5, BT, PI and epoxy resin.

4. The method of claim 1, wherein said metal material includes Cu, Cu/Ni or Sn/Ag/Cu.

* * * * *